(12) United States Patent
Min et al.

(10) Patent No.: US 7,517,742 B2
(45) Date of Patent: Apr. 14, 2009

(54) AREA DIODE FORMATION IN SOI APPLICATION

(75) Inventors: Byoung W. Min, Austin, TX (US);
Laegu Kang, Austin, TX (US); Michael Khazhinsky, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 372 days.

(21) Appl. No.: 11/158,021

(22) Filed: Jun. 21, 2005

(65) Prior Publication Data
US 2006/0284278 A1 Dec. 21, 2006

(51) Int. Cl.
*H01L 21/20* (2006.01)
(52) U.S. Cl. ............... 438/155; 438/237; 257/E27.051; 257/350
(58) Field of Classification Search ............. 438/149, 438/155; 257/E27.051
See application file for complete search history.

(56) References Cited

U.S. PATENT DOCUMENTS

| | | | |
|---|---|---|---|
| 4,908,328 A * | 3/1990 | Hu et al. ............... | 438/269 |
| 6,472,753 B2 * | 10/2002 | Kondo et al. ............... | 257/758 |
| 6,500,723 B1 | 12/2002 | Khazhinsky et al. ......... | 438/382 |
| 6,611,024 B2 * | 8/2003 | Ang et al. ............... | 257/350 |
| 6,653,670 B2 | 11/2003 | Ker et al. ............... | 257/199 |
| 7,064,041 B2 * | 6/2006 | Tanaka ............... | 438/311 |
| 2001/0008292 A1 * | 7/2001 | Leobandung et al. ........ | 257/347 |
| 2003/0089948 A1 | 5/2003 | Min ............... | 257/347 |
| 2003/0122124 A1 * | 7/2003 | Nagano et al. ............... | 257/48 |
| 2006/0255330 A1 * | 11/2006 | Chen et al. ............... | 257/18 |

OTHER PUBLICATIONS

Salman, A. et al., ESD Protection for SOI Technology using an Under-The-Box (Substrate) Diode Structure; 2004 EOS/ESD Symposium; 7 pages.

* cited by examiner

*Primary Examiner*—Jerome Jackson, Jr.
*Assistant Examiner*—Paul A Budd
(74) *Attorney, Agent, or Firm*—John A. Fortkort; Fortkort & Houston P.C.

(57) ABSTRACT

A method for making a semiconductor device is provided herein. In accordance with the method, a semiconductor stack is provided which includes a semiconductor substrate, a first semiconductor layer, and a first dielectric layer disposed between the substrate and the first semiconductor layer. A first trench is formed in the first dielectric layer which exposes a portion of the substrate, and a first implant region is formed in the first trench. Cathode and anode regions are formed in the first implant region.

19 Claims, 5 Drawing Sheets

AREA DIODE FORMATION IN SOI APPLICATION

FIELD OF THE DISCLOSURE

The present disclosure relates generally to semiconductor devices, and more particularly to SOI devices having area diodes and to methods for making the same.

BACKGROUND OF THE DISCLOSURE

Electrostatic discharge (ESD) protection has emerged as a significant challenge for semiconductor devices. ESD, originating from such sources as mechanical chip carriers, plastic chip storage devices, or human contact, can generate voltages that are many times greater than the design voltages of integrated circuits. For example, the human body can supply an electrostatic discharge of up to 4 kilovolts, which can be devastating to integrated circuits that commonly operate at voltages of less than 5V.

In light of the challenge posed by ESD, many semiconductor devices are now equipped with ESD dissipation features. However, in a typical silicon-on-insulator (SOI) device, the presence of a buried oxide (BOX) layer places limitations on the structures that can be used for ESD protection. In particular, the presence of the BOX layer in SOI devices complicates the implementation of vertical NPN or diode structures. Moreover, the poor thermal conductivity of the buried oxide causes thermal failure levels to be much lower in SOI devices than in analogous bulk devices.

In addition, an accurate temperature sensing has been a big issue the most recent micro processor application. Ideality factor of diode has been recognized as a key parameter in temperature sensing devices. The conventional lateral diode in SOI application showed high series resistance and poor thermal conductivity, causing a significant deviation from a diode ideality.

Despite the foregoing problems, diode structures have been built on SOI films that provide some ESD protection and temperature sensing. FIG. 1 illustrates one example of a conventional lateral diode 101 structure built on an SOI film. The diode comprises a buried oxide layer 103 upon which is disposed a device layer 105 that includes cathode 107 and anode 109 implants and an N-well 111. A polysilicon gate 113 is disposed over the N-well 111 and is electrically insulated from the N-well 111 by a gate oxide layer 115. The polysilicon gate 113 is bounded on each side by spacers 117, 119.

While lateral diodes of the type depicted in FIG. 1 provide some ESD protection, the protection they afford is typically lower than that achievable with comparable bulk devices. More recently, however, it has been shown that further improvements in ESD protection can be achieved through the use of vertical diode structures. Such structures have been found to offer improved ESD protection compared to their lateral diode counterparts, due to improved lattice temperature distribution. Vertical diode structures offer the further advantage of occupying less space than their lateral counterparts.

An example of a vertical diode structure is depicted in FIG. 2. The vertical diode 151 depicted therein comprises a substrate 153 within which is defined an N-well 155. Anode 157 and cathode 159 regions are implanted in the N-well 155 and are in electrical contact with anode 161 and cathode 163 electrodes, respectively. A buried oxide (BOX) layer 165 is disposed over the N-well 155 adjacent to the anode 157 and cathode 159 regions. A shallow trench isolation (STI) layer 167 is disposed over the BOX layer 165 in the area between the anode 157 and cathode 159 regions, and an SOI layer 171 is disposed over the BOX layer 165 elsewhere. An interlayer dielectric (ILD) 173 is disposed over the substrate 153 in the vicinity of the anode 157 and cathode 159 electrodes and over the SOI layer 171 and STI layer 167.

While vertical diode structures of the type depicted in FIG. 2 do have some desirable attributes from an ESD protection perspective, they have two significant disadvantages. One is relatively low packing densities. This is a significant disadvantage in light of the ongoing trend in the semiconductor industry towards further miniaturization. The second is difficulty in formation of N-well 155. Since the N-well is under STI 167 and Box 167, it's not so easy to make it in conventional CMOS process. There is thus a need in the art for methods and devices which address the aforementioned infirmities. In particular, there is a need in the art for SOI devices having ESD and/or temperature sensing structures, and for methods for making the same, which have higher packing densities. There is further a need in the art for such SOI devices that exhibit thermal failure levels that are comparable to those observed in analogous bulk devices. These and other needs are met by the devices and methodologies described herein.

SUMMARY OF THE DISCLOSURE

In one aspect, a method for making a semiconductor device is provided herein. In accordance with the method, a semiconductor stack is provided which comprises a semiconductor substrate, a first semiconductor layer, and a first dielectric layer disposed between the substrate and the first semiconductor layer. A first trench is formed in the first dielectric layer which exposes a portion of the substrate, and a first implant region is formed in the first trench. Cathode and anode regions are formed in the first implant region.

In another aspect, a method for making a semiconductor device is provided. In accordance with the method, a substrate is provided which has a first semiconductor layer disposed thereon. A first dielectric layer is disposed between the substrate and the first semiconductor layer. A portion of the first dielectric layer is then exposed, and a second dielectric layer is formed over the exposed portion of the first dielectric layer. A trench is created which extends through the first and second dielectric layers and which exposes a portion of the substrate. A second semiconductor layer is then formed over the exposed portion of the substrate, and source and drain regions are formed in the second semiconductor layer.

In still another aspect, a semiconductor device is provided which comprises (a) a substrate having a first dielectric layer disposed thereon, (b) a first semiconductor layer disposed over a first region of the first dielectric layer, (c) a second dielectric layer disposed over a second region of the first dielectric layer, and (d) an implant region, disposed on said substrate, which extends through the first dielectric layer and the second dielectric layer and which has source and drain regions defined therein.

These and other aspects of the present disclosure are described in greater detail below.

DETAILED DESCRIPTION

It has now been found that the packing densities of vertical diode SOI devices can be significantly increased by forming the diodes on top of the substrate, and within a trench formed in the buried oxide (BOX) layer. This approach may be facilitated, in some embodiments, by the use of suitable spacer structures. SOI devices can be made by this methodology which have ESD and/or temperature sensing structures.

Figure 3:
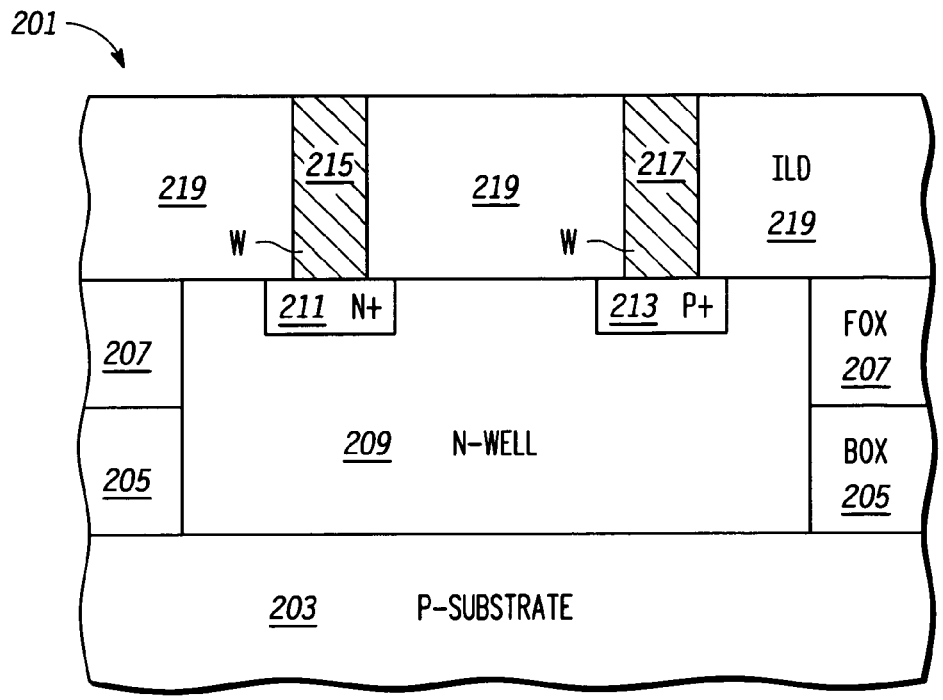
FIG. 3 is an illustration of an embodiment of area diode made in accordance with the teachings herein.

FIG. 3 illustrates a first non-limiting embodiment of a diode structure made in accordance with the teachings herein. As shown therein, the diode structure 201 comprises a substrate 203 upon which is disposed a layer of buried oxide (BOX) 205 and a layer of field oxide (FOX) 207. An N-well 209 (which, in other embodiments, could be a P-well) is disposed on the substrate and is bounded by the BOX layer 205 and the FOX layer 207. A cathode region 211 and an anode region 213 are implanted in the N-well region 209, and are in electrical contact with a cathode electrode 215 and an anode electrode 217, respectively. The structure is covered with an interlayer dielectric 219.

Figure 1:
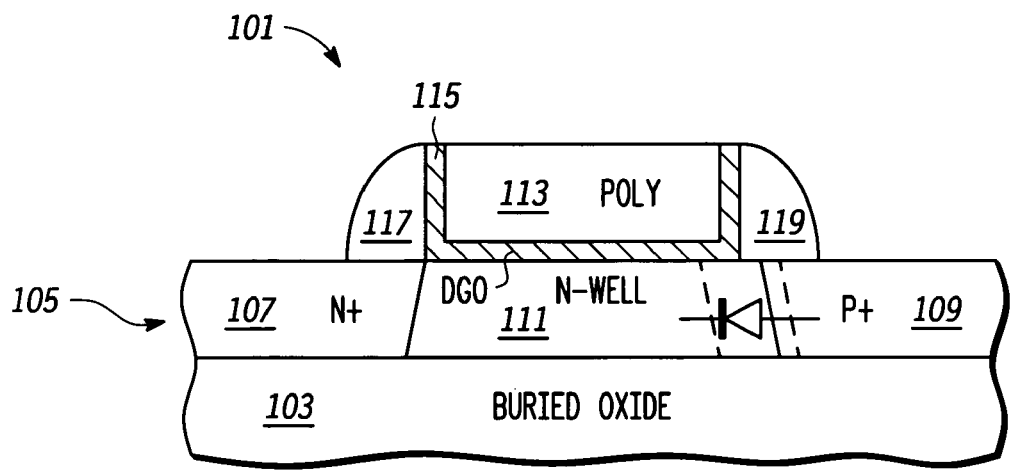
FIG. 1 is an illustration of a prior art lateral edge diode.
Figure 2:
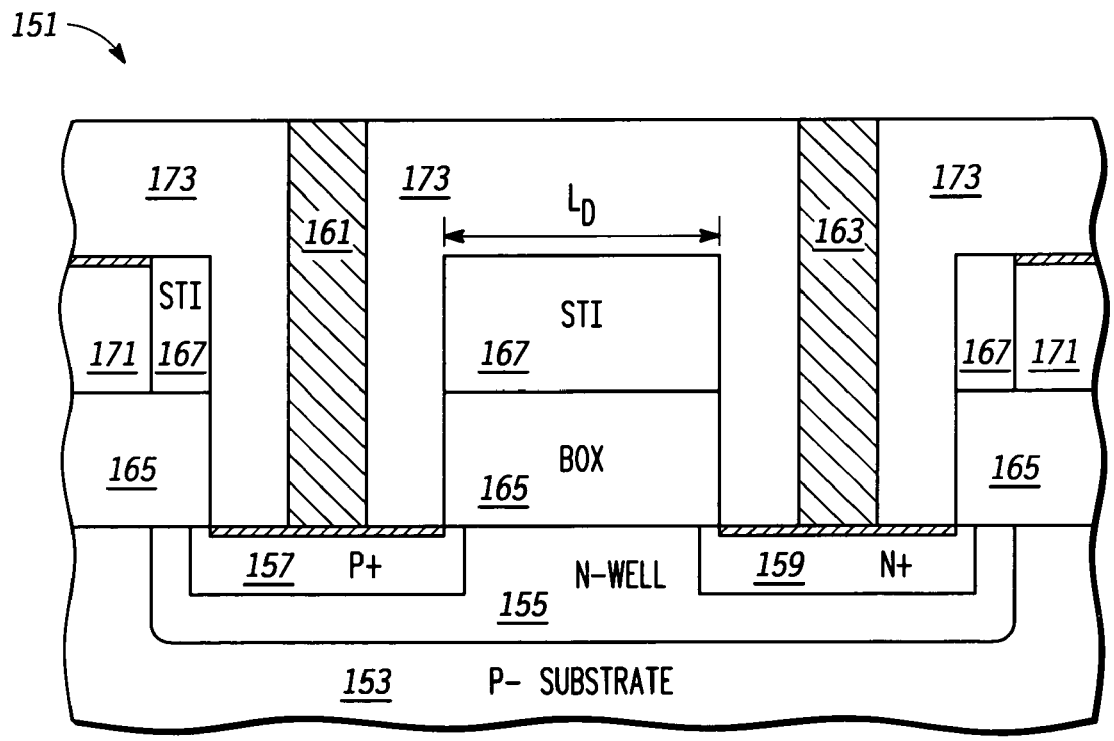
FIG. 2 is an illustration of a prior art vertical diode.

Compared to the SOI vertical diode of FIG. 2, the N-well 209 of the SOI vertical diode of FIG. 3 is significantly closer to the surface of the device, and the cathode 211 and anode 213 regions are also significantly closer to the surface. Consequently, the trenches in the ILD that are used to form the contacts 215, 217 for these regions may be of much smaller diameter than those used to create the cathode 161 and anode 163 contacts of FIG. 2. This is due to the fact that variances in trench positioning increase with depth, and because the anisotropy of etching processes used to form the trench are typically less than perfect. Consequently, the methodologies described herein can be used to make SOI vertical diodes with improved packing density and diode ideality. Moreover, the formation of the N-well/contact structures in the vertical diode of FIG. 3 requires the formation of a single layer trench in the BOX and FOX layers, while the vertical diode structure of FIG. 2 requires many narrow trenches to define cathodes and anodes. Since the combined variances in trench placement for many narrow trenches is greater than that associated with a single large trench, this factor further increases packaging density for the vertical diode structure of FIG. 3 as compared to the vertical diode structure of FIG. 2. The NWELL 209 is formed the surface, while the prior art, FIG. 2, has NWELL 155 is formed under very thick stack of STI 167 and BOX 165 which could induce deteriorate effect on other active devices on the same wafer.

Figure 4:
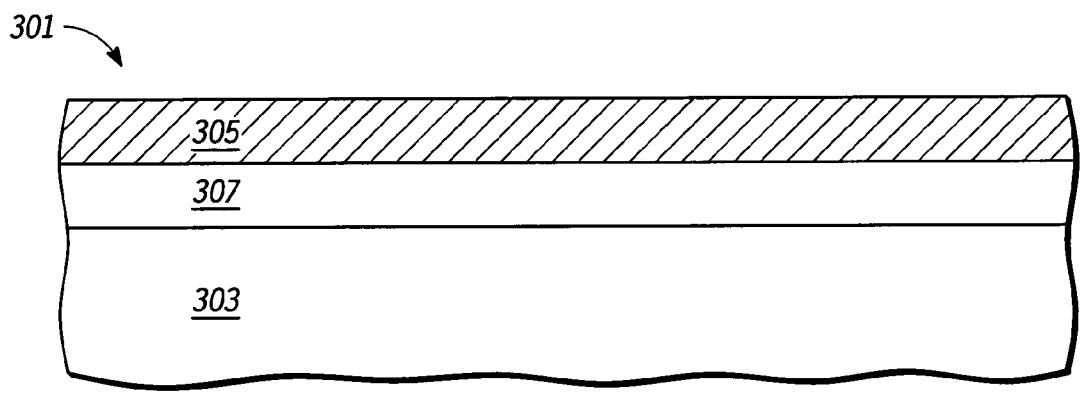
FIG. 4 is an illustration of one step in a process for making area diodes in accordance with the teachings herein.

FIGS. 4-12 illustrate one particular, non-limiting embodiment of a method that may be used to make a vertical diode structure of the type disclosed herein. With reference to FIG. 4, a wafer 301 is provided which contains a substrate 303. The substrate 303 may be a P-type or N-type substrate, and has a semiconductor layer 305 disposed thereon. A buried oxide (BOX) layer 307 is disposed between the semiconductor layer 305 and the substrate 303. A wafer of the type depicted in FIG. 4 may be formed from a handle wafer and a donor wafer using methods that are well known to the art.

The semiconductor layer 305 in the wafer depicted in FIG. 4 preferably comprises Si or Ge, and even more preferably comprises pure, single crystal Si or Ge, but may also comprise SiGe, GeC, SiGeC, or SiC. The BOX layer 307 preferably comprises silicon oxide, but may also comprise germanium oxide or silicon nitride. It will be appreciated that the wafer 301 depicted in FIG. 4 may contain various other layers and features as are known to the art, but that these additional layers and features have been omitted for simplicity of illustration.

Figure 5:
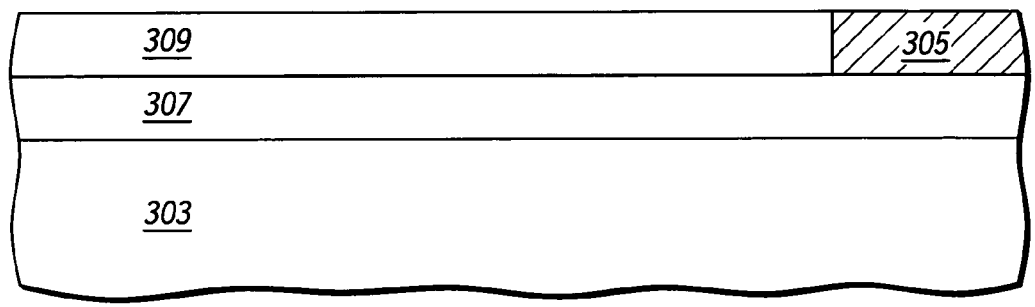
FIG. 5 is an illustration of one step in a process for making area diodes in accordance with the teachings herein.

As shown in FIG. 5, a portion of the semiconductor layer 305 is removed through the use of a suitable etching technique. Removal of the portion of the semiconductor layer will typically involve depositing a layer of photoresist over the semiconductor layer 305, patterning the photoresist to form a suitable mask, and treating the exposed portion of the semiconductor layer 305 with aqueous HF or another suitable etchant. The removed portion of the semiconductor layer 305 is then replaced with a field oxide layer 309 using chemical vapor deposition (CVD) or another suitable technique.

Figure 6:
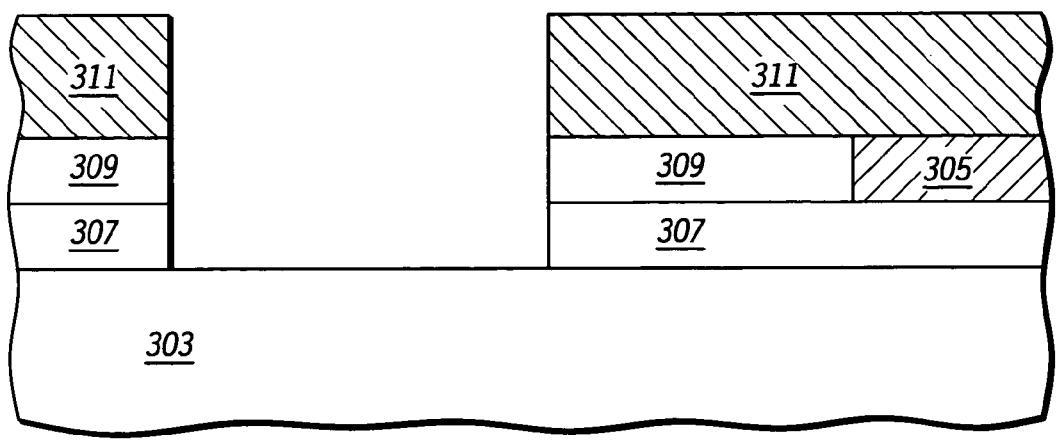
FIG. 6 is an illustration of one step in a process for making area diodes in accordance with the teachings herein.

FIG. 6 illustrates the formation of a substrate window in the structure of FIG. 5. As shown in FIG. 6, a layer of photoresist 311 is deposited over the structure and is patterned and exposed using suitable photolithographic techniques to define an opening therein which exposes a portion of the field oxide layer 309. The exposed portion of the field oxide layer 309 and the underlying portion of the BOX layer 307 are subsequently removed by etching, thereby exposing a portion of the substrate 303.

Figure 7:
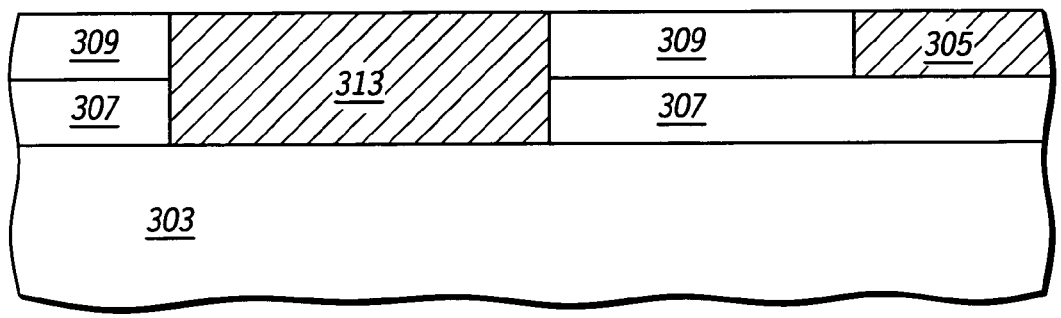
FIG. 7 is an illustration of one step in a process for making area diodes in accordance with the teachings herein.

As shown in FIG. 7, a layer of semiconductor material 313 is then epitaxially grown on the exposed surface of the substrate, after which the layer of photoresist 311 is stripped from the structure, typically through the use of a suitable solvent. The resulting structure may optionally be subjected to chemical mechanical planarization (CMP) at this point to compensate for any non-planarity in the surface as a result of epitaxial growth.

Figure 8:
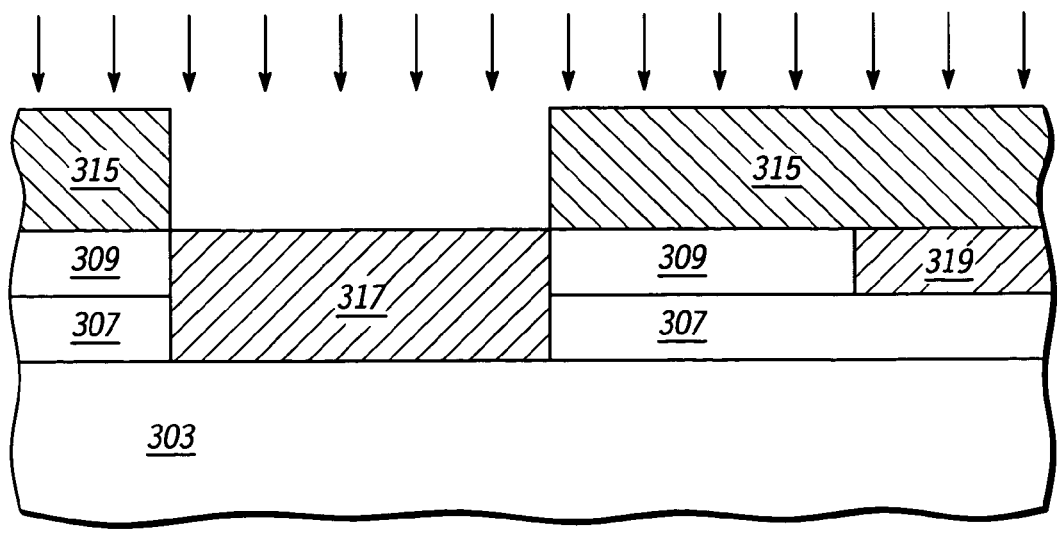
FIG. 8 is an illustration of one step in a process for making area diodes in accordance with the teachings herein.

As shown in FIG. 8, a layer of photoresist 315 is then deposited over the structure and is patterned and exposed using suitable photolithographic techniques to define an opening therein which exposes at least a portion of the layer of epitaxially grown semiconductor material 313. The exposed portion of the semiconductor material 313 is then subjected to ion implantation to define an N-well 317 therein. It will be appreciated, of course, that the same general approach may be used to form a P-well, in which case a dopant of reversed polarity would be used. In some variations of the methodology described herein, the N-well 317 may be formed by incorporating a suitable dopant into the semiconductor layer 313 as it is epitaxially grown, which in some cases may remove the need for the subsequent ion implantation step depicted in FIG. 8.

As shown in FIG. 8, a P-well 319 has also been defined in the semiconductor layer 305 of FIG. 7. The P-well 319 may be formed using the same general type of masking and implantation steps as described above in reference to the formation of the N-well 317, but using a dopant of reversed polarity. The P-well 319 may be formed before or after the formation of the N-well 317, and will typically require separate masking and implantation steps. In some applications, however, as in applications where the wells 317 and 319 have the same polarity, they may be formed in a single masking and implantation step.

Figure 9:
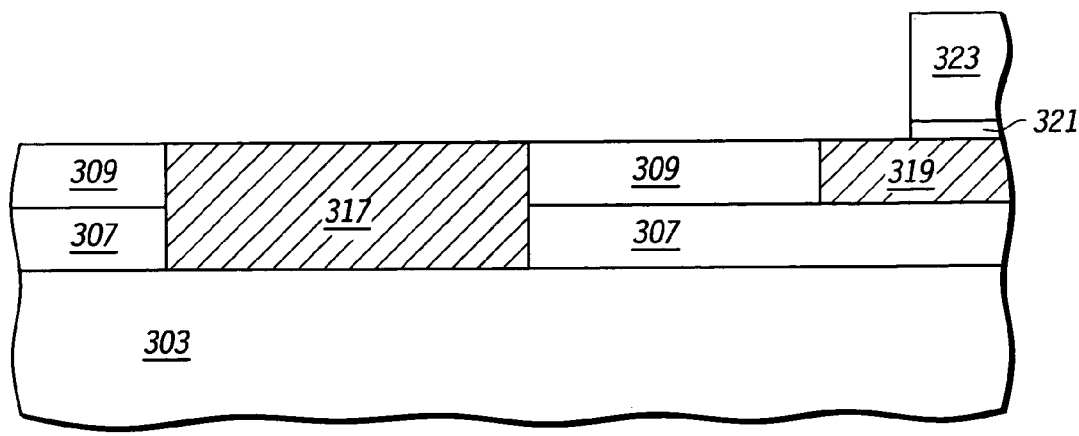
FIG. 9 is an illustration of one step in a process for making area diodes in accordance with the teachings herein.

As shown in FIG. 9, a layer of gate dielectric 321 is defined over a portion of the P-well 319. This may be accomplished, for example, by forming a suitable mask over the structure which exposes a portion of the P-well 319, followed by a suitable thermal oxidation or deposition process. A gate 323 is then defined over the gate dielectric 321, as through masking and deposition or by another suitable process. The gate dielectric 321 may comprise various materials, including, but not limited to, silicon oxide, germanium oxide, and various metal oxides. The gate 323 may comprise polysilicon, various conductive metals, or other suitable gate materials as are known in the art.

Figure 10:
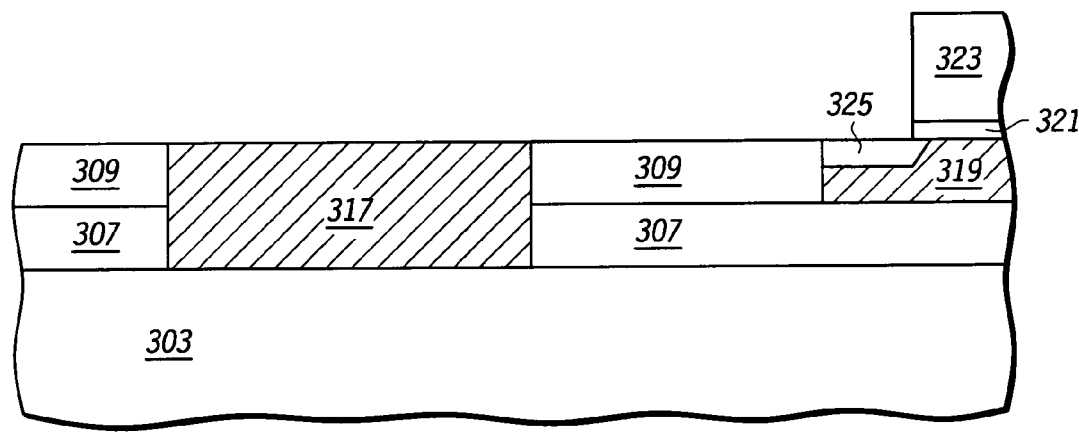
FIG. 10 is an illustration of one step in a process for making area diodes in accordance with the teachings herein.

As shown in FIG. 10, one or more extension layers 325 are then formed in the P-well 319. Preferably, this is achieved through shallow ion implantation used in conjunction with an implantation mask that exposes a portion of the P-well 319 in the vicinity of the gate 323, although other suitable techniques may also be employed.

Figure 11:
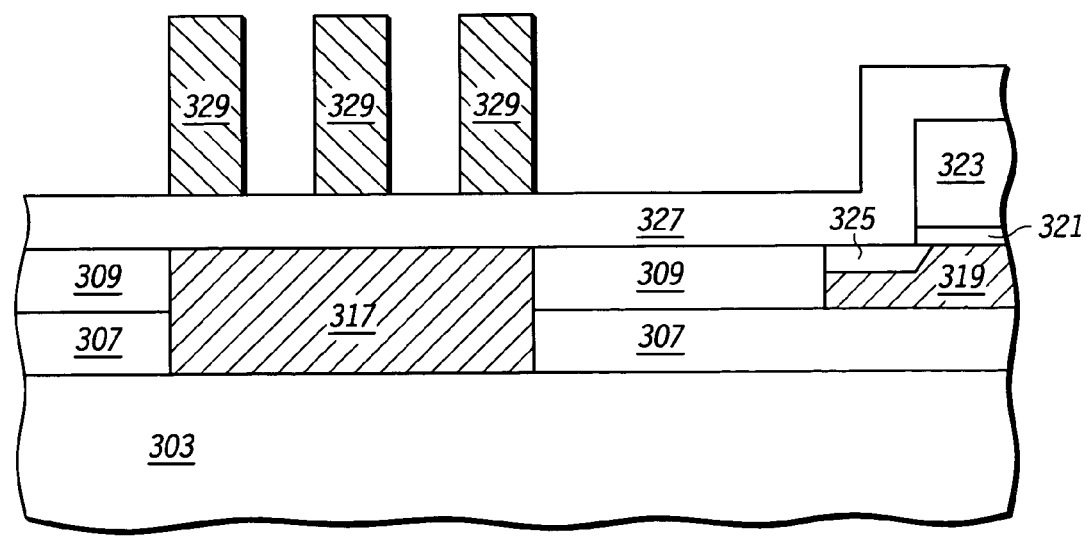
FIG. 11 is an illustration of one step in a process for making area diodes in accordance with the teachings herein.
Figure 12:
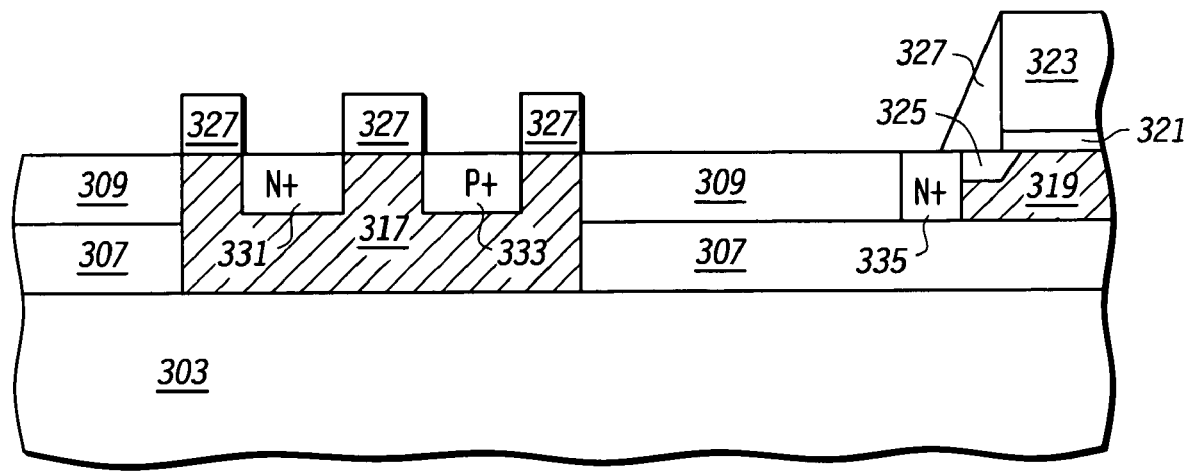
FIG. 12 is an illustration of one step in a process for making area diodes in accordance with the teachings herein.

As shown in FIG. 11, a layer of spacer material 327 is then deposited over the structure, which itself is followed by deposition of a layer of a suitable photoresist 329. The layer of photoresist 329 is then patterned and exposed through the use of suitable photolithographic techniques to form a mask which exposes portions of the layer of spacer material 327.

A suitable etchant is then used to remove the exposed portions of the spacer layer 327. Cathode 331 and anode 333 regions are subsequently implanted in the exposed portions of the N-well 317. Similarly, a source or drain region 335 is implanted in the P-well 319 to form typical transistors. Implantation processes that may be used to form the source and drain regions and the N-wells and P-wells in the structures depicted herein are well known to the art and involve the use of suitable dopants which, depending on the polarity of the structure being formed, may include n-type species such as phosphorous or arsenic, or p-type species such as gallium or boron. Also, as previously noted, these implantation steps may be avoided in some cases through the incorporation of a suitable dopant into the materials of these regions as they are being formed. In some embodiments of the methodology described herein, the structure may be subjected to silicidation after the cathode 331 and anode 333 regions have been defined, which will generally involve depositing a metal over the structure and exposing the structure to a heated atmosphere to form silicide wherever the metal contacts silicon or other semiconductor materials.

Figure 13:
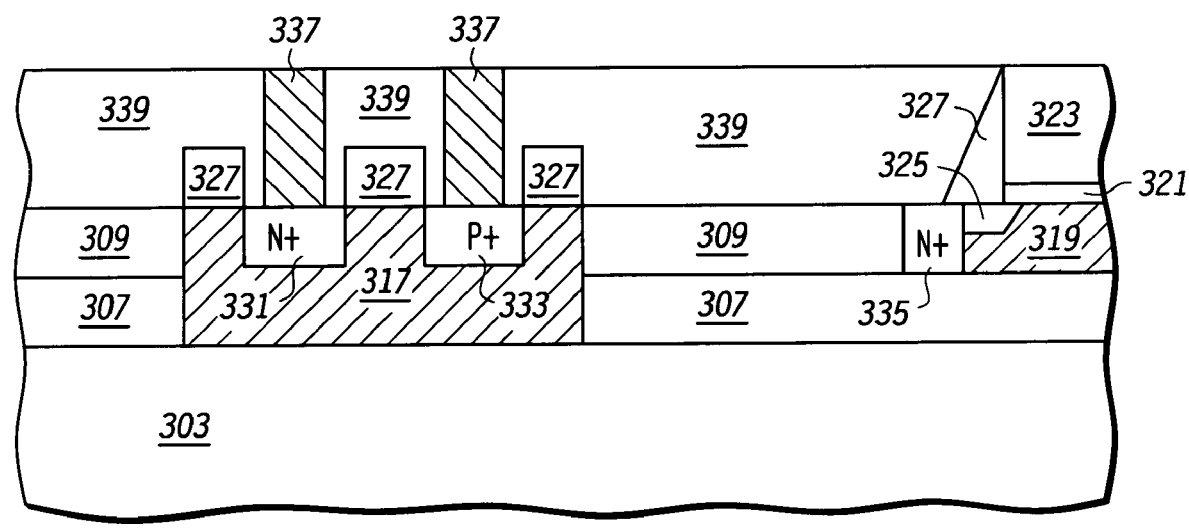
FIG. 13 is an illustration of one step in a process for making area diodes in accordance with the teachings herein.

As shown in FIG. 13, an Inter-Layer Dielectric (ILD) 331 is then deposited over the structure. The ILD 331 may comprise silicon nitride, boron nitride, or other suitable ILD materials as are known to the art. The ILD 331 is subsequently masked and etched to define trenches therein which terminate at the surfaces of the source regions 331 and 335 and the drain region 333. The trenches are then backfilled with tungsten 337 or another suitable electrode material.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
   providing a semiconductor stack comprising a semiconductor substrate, a first semiconductor layer, and a first dielectric layer disposed between the substrate and the first semiconductor layer;
   forming a first trench in the first dielectric layer which exposes a portion of the substrate; forming a second semiconductor layer, at least a portion of which is disposed in the first trench;
   forming a first implant region in the second semiconductor layer;
   forming an interlayer dielectric (ILD) over the first implant region;
   forming cathode and anode regions in the second semiconductor layer;
   forming second and third trenches which extend through the ILD and expose at least a portion of the cathode and anode regions, respectively; and
   forming electrical contacts in the second and third trenches.

2. The method of claim 1, wherein the second semiconductor layer is formed by epitaxially growing a layer of semiconductor material on the portion of the substrate exposed within the first trench.

3. The method of claim 1, wherein the second semiconductor layer is doped.

4. The method of claim 1,
   wherein a second dielectric layer is disposed over the first dielectric layer, and wherein the first trench extends through both the first and second dielectric layers.

5. The method of claim 4, wherein the first dielectric layer is a buried oxide (BOX) layer, and wherein the second dielectric layer is a field oxide (FOX) layer.

6. The method of claim 1, further comprising the step of forming a second implant region in the first semiconductor layer.

7. The method of claim 1 wherein the cathode and anode regions are formed by depositing a layer of spacer material over the first implant region, etching the layer of spacer material such that first and second regions of the first implant region are exposed, and implanting cathode and anode regions in the first and second regions of the first implant region, respectively.

8. The method of claim 7, wherein the layer of spacer material is etched such that a spacer structure is formed between the cathode and anode regions.

9. The method of claim 7, wherein the layer of spacer material is etched such that the spacer material covers substantially the entire surface of the first implant region exclusive of the cathode and anode regions.

10. A method for making a semiconductor device, comprising:
    providing a substrate having a first semiconductor layer disposed thereon and having a first dielectric layer disposed between the substrate and the first semiconductor layer;
    exposing a portion of the first dielectric layer;
    forming a second dielectric layer over the exposed portion of the first dielectric layer;
    creating a trench through the first and second dielectric layers which exposes a first portion of the substrate;
    forming a second semiconductor layer over the first portion of the substrate; and forming cathode and anode regions in the second semiconductor layer.

11. The method of claim 10, further comprising doping the second semiconductor layer so as to define an N-well or a P-well therein.

12. A method for making a semiconductor device, comprising:
providing a semiconductor stack comprising a semiconductor substrate, a first semiconductor layer, and a first dielectric layer disposed between the substrate and the first semiconductor layer;
forming a first trench in the first dielectric layer which exposes a portion of the substrate;
forming a second semiconductor layer, at least a portion of which is disposed in the first trench; and
forming cathode and anode regions in the second semiconductor layer;
wherein the cathode and anode regions are formed by depositing a layer of spacer material over a first implant region, etching the layer of spacer material such that first and second regions of the first implant region are exposed, and implanting cathode and anode regions in the first and second regions of the first implant region, respectively.

13. The method of claim 12, wherein the layer of spacer material is etched such that a spacer structure is formed between the cathode and anode regions.

14. The method of claim 12, wherein the layer of spacer material is etched such that the spacer material covers substantially the entire surface of the first implant region exclusive of the cathode and anode regions.

15. A method for making a semiconductor device, comprising:
providing a semiconductor stack comprising a semiconductor substrate, a first semiconductor layer, a first dielectric layer disposed between the substrate and the first semiconductor layer, and a second dielectric layer disposed over the first dielectric layer;
forming a first trench which exposes a portion of the substrate and which extends through both the first and second dielectric layers;
forming a second semiconductor layer, at least a portion of which is disposed in the first trench; and
forming cathode and anode regions in the second semiconductor layer;
wherein the semiconductor device is a diode.

16. The method of claim 15, wherein the second semiconductor layer is formed by epitaxially growing a layer of semiconductor material on the portion of the substrate exposed within the first trench.

17. The method of claim 15, further comprising:
forming first and second implant regions in the second semiconductor layer;
forming an interlayer dielectric (ILD) over the first and second implant regions;
forming second and third trenches which extend through the ILD and expose at least a portion of the cathode and anode regions, respectively; and
forming electrical contacts in the second and third trenches.

18. The method of claim 15, wherein the cathode and anode regions are formed by depositing a layer of spacer material over a first implant region, etching the layer of spacer material such that first and second regions of the first implant region are exposed, and implanting cathode and anode regions in the first and second regions of the first implant region, respectively.

19. The method of claim 18, wherein the layer of spacer material is etched such that a spacer structure is formed between the cathode and anode regions.

* * * * *